(12) United States Patent
Lukanc et al.

(10) Patent No.: US 6,514,802 B2
(45) Date of Patent: Feb. 4, 2003

(54) METHOD OF PROVIDING A FRONTSIDE CONTACT TO A SUBSTRATE OF SOI DEVICE

(75) Inventors: Todd P. Lukanc, San Jose, CA (US); Kurt O. Taylor, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/054,149

(22) Filed: Jan. 22, 2002

(65) Prior Publication Data

US 2002/0094666 A1 Jul. 18, 2002

Related U.S. Application Data

(63) Continuation of application No. 09/597,357, filed on Jun. 16, 2000, now Pat. No. 6,355,511.

(51) Int. Cl.$^7$ ................................................ H01L 21/00
(52) U.S. Cl. ........................ 438/152; 438/386; 438/430; 438/586
(58) Field of Search ................................. 438/586, 152, 438/404, 432, 517, 533, 667, 386, 131, 430, 424; 257/77, 502, 508, 717, 684

(56) References Cited

U.S. PATENT DOCUMENTS

| | | | |
|---|---|---|---|
| 5,314,841 A | * 5/1994 | Brady et al. | ............... 438/517 |
| 5,326,722 A | 7/1994 | Huang | ........................ 437/186 |
| 5,445,988 A | * 8/1995 | Schwalke | .................. 438/432 |
| 5,767,578 A | 6/1998 | Chang et al. | ............... 257/717 |
| 5,770,875 A | * 6/1998 | Assaderaghi et al. | ....... 257/301 |

FOREIGN PATENT DOCUMENTS

| | | | |
|---|---|---|---|
| EP | 635884 A1 | 6/1994 | .......... H01L/21/74 |
| GB | 2346260 A | 2/2000 | .......... H01L/21/74 |

* cited by examiner

Primary Examiner—Olik Chaudhuri
Assistant Examiner—Yennhu B. Huynh

(57) ABSTRACT

A method for making frontside contact to a substrate through an SOI structure thereon is provided. An etching step is undertaken to form a trench in the SOI structure so as to expose and define a rug surface of the substrate. Then, a thin insulating layer, for example $SiO_2$, is formed over the exposed surface of the substrate, this insulating layer being irregular because of its formation over the relatively rough etched surface. Contact material is provided in the trench, and electrical potential is applied across the contact and substrate sufficient to increase the conductivity of the insulating layer, i.e., to break down the insulating layer. Nitrogen may be implanted into the exposed surface of the substrate to slow subsequent growth of the insulating layer, resulting in an even thinner insulating layer, i.e., one even less resistant to breakdown upon application of electrical potential thereacross. If the insulating layer thereon is sufficiently thin or irregular, ohmic contact may be achieved between the contact and substrate without the application of such electrical potential. In yet another embodiment, prior to formation of the insulating layer, the exposed surface of the substrate and wall of the trench are fabricated such that meet at an abrp angle. Insulating material formed in ths area is of poor quality, readily lending itself to breakdown upon application of electrical potential across the contact material and substrate.

14 Claims, 4 Drawing Sheets

METHOD OF PROVIDING A FRONTSIDE CONTACT TO A SUBSTRATE OF SOI DEVICE

This is a Continuation Application of U.S. patent application Ser. No. 09/597,357 entitled NOVEL FRONTSIDE CONTACT TO SUBSTRATE OF SOI DEVICE, invented by Todd P. Lukanc and Kurt O. Taylor, filed Jun. 16, 2000 now U.S. Pat. No. 6,355,511, assigned to Advanced Micro Devices, Inc.

BACKGROUND OF THE INVENTION

1. Field of the Invention

This invention relates generally to processing of Silicon-On-Insulator (SOI) devices, and more particularly, to a method of forming a frontside contact to the silicon substrate of an SOI wafer.

2. Discussion of the Related Art

As is well known, the presence of a semiconductor substrate directly under active devices provides operational limitations on those devices. SOI technology, which provides an insulating layer between the active devices and the semiconductor substrate, has been shown to provide many advantages over technology wherein such insulating layer is not included. For example, these advantages include higher speed, lower power consumption and better resistance to radiation upset.

One of the problems faced in using SOI technology is to provide a bias or ground to the silicon substrate, through electrical contact with the substrate. While electrical contact can be made to the backside of the substrate, extra processing on the backside of the wafer is required to achieve this.

U.S. Pat. No. 5,314,841 issued to Brady et al. on May 24, 1994 addresses these problems by providing a frontside contact to the semiconductor substrate of an SOI wafer. However, this approach is dependant on a relatively complicated process of opening and covering trench regions so that the lightly doped semiconductor substrate may be implanted with ions in order for it to become more heavily doped. While frontside contact to the substrate is provided, this disclosed process requires numerous masking and patterning steps to achieve the desired result, adding to the complexity and expense of the process. It would be highly advantageous to provide an effective process for achieving such frontside contact to the substrate which does not require the complicated masking and patterning steps disclosed in that patent.

SUMMARY OF THE INVENTION

In the present invention, in the environment of an SOI structure on a semiconductor substrate, a method for making frontside contact to the substrate is provided. A trench is etched in the SOI structure to expose a surface of the substrate. The etching causes the exposed surface of the substrate to be relatively rough. Next, an insulating layer is formed (for example $SiO_2$ is grown or deposited) over the exposed surface of the substrate, this insulating layer being thin and irregular because of its formation over the relatively rough etched surface. Then, contact material is provided in the trench, and an electrical potential is provided across the contact and substrate sufficient to increase the conductivity of the insulating layer. Prior to providing the insulating layer, nitrogen may be implanted into the exposed surface of the substrate to slow subsequent growth of the insulating layer, resulting in an even thinner insulating layer, i.e., one even less resistant to breakdown upon application of electrical potential across the contact and substrate. In situations where the insulating layer is sufficiently irregular, or is sufficiently thin, an ohmic contact may be achieved between the contact and substrate without the application of electrical potential thereacross. As yet another approach, prior to forming the insulating layer, the exposed surface of the substrate and the wail of the trench are fabricated such that they meet at an abrupt angle. Then, when the insulating layer is provided, for example by growing, the insulating material which forms in the corner defined by the abrupt angle is of poor quality, lending itself readily to breakdown upon application of electrical potential across the contact and substrate.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
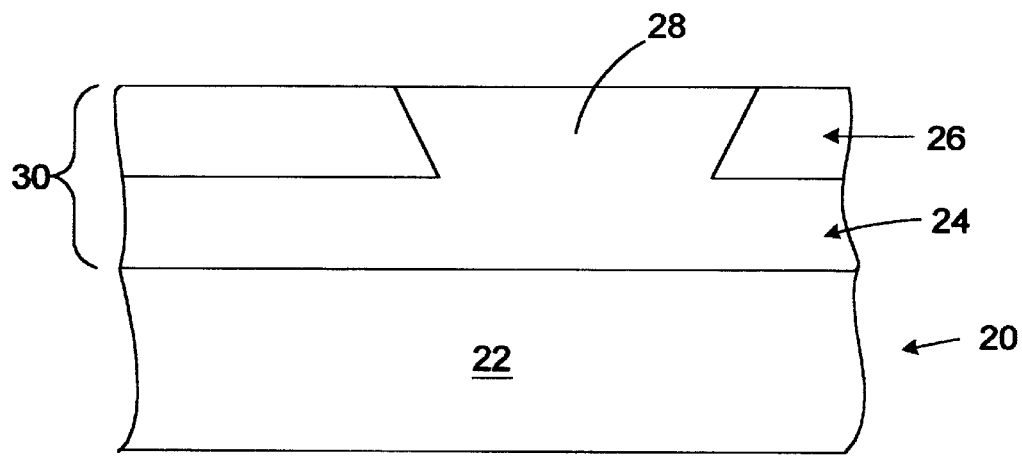
FIG. 1 is a sectional view of a semiconductor device including an SOI structure on a semiconductor substrate.

FIG. 1 shows a cross-section of an SOI semiconductor structure 20 including a lightly doped p-type silicon substrate 22 (having a doping level of for example $10^{14}$–$10^{16}$ ions/cm$^3$) having a silicon dioxide (SiO$_2$) layer 24, for example 2000 angstroms thick, thereon. Provided on the SiO$_2$ layer 24 is a lightly doped p-type silicon layer 26 (having a doping level of for example $10^{14}$–$10^{16}$ ions/cm$^3$) which includes SiO$_2$ shallow trench isolation regions, for example that shown at 28, connecting with the SiO$_2$ layer 24. The SiO$_2$ layer 24 and silicon layer 26 with shallow trench isolation regions 28 make up the silicon-on-insulator structure 30 which is disposed on the silicon substrate 22.

Figure 2:
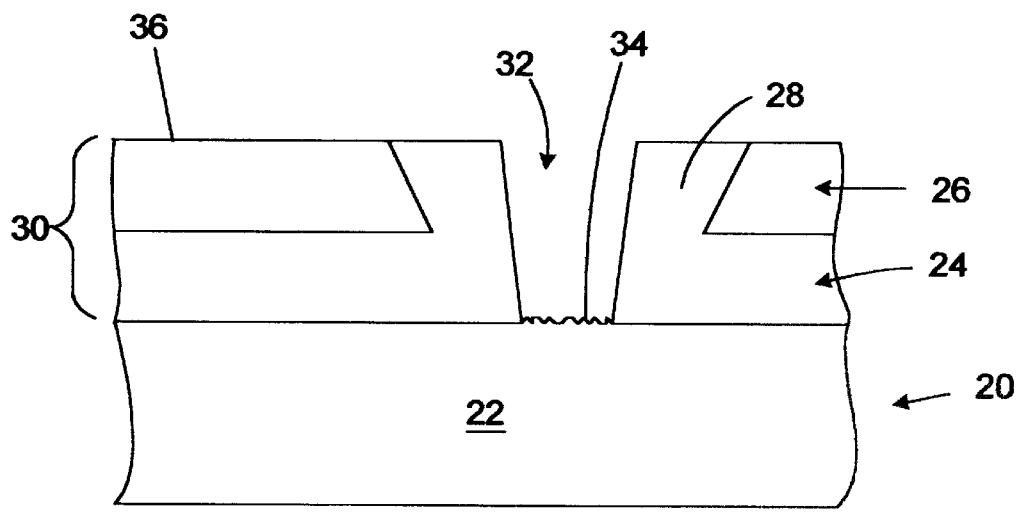
FIG. 2 is a sectional view similar to that shown in FIG. 1 and showing a trench formed in the SOI structure.

Referring to FIG. 2, after appropriate masking, a trench 32 is etched in the silicon-on-insulator structure 30 down to the silicon substrate 22, exposing a surface 34 of the substrate. This etching step takes place just prior to cleaning of the surface of the silicon at 36 for subsequent provision of the insulator thereon, for example by growing SiO$_2$ thereon. While this etching can take place anywhere as chosen through the silicon-on-insulator structure 30, such etching with advantage can take place through a shallow trench isolate region 28 and then through the SiO$_2$ layer 24, so that silicon area is saved for further processing.

In anticipation of formation of gate insulator, the surface 36 of the silicon is cleaned in a manner as is well-known. However, during this cleaning step, the surface 34 of the silicon substrate 22 which has been exposed through the etching step is purposely not cleaned, but is allowed to remain in a relatively rough state due to the etchant having acted thereon.

Figure 3:
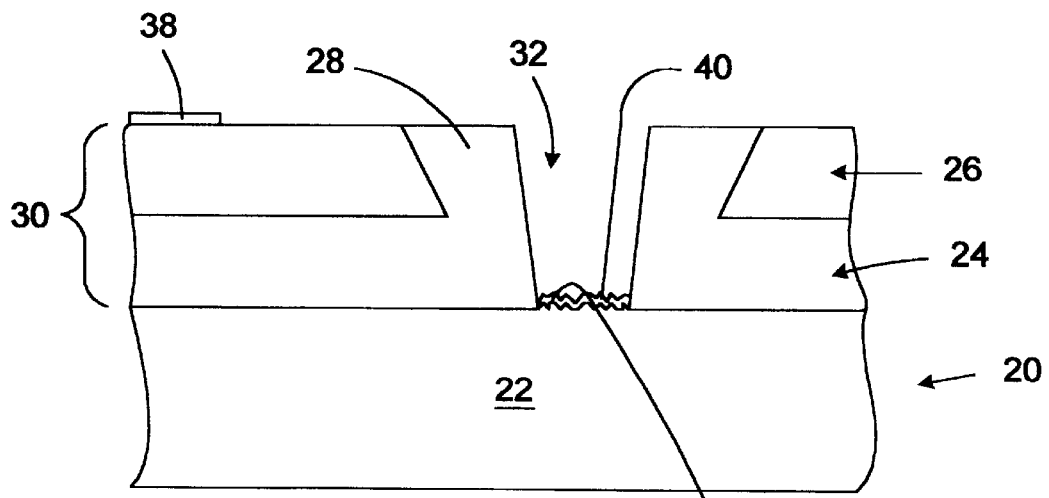
FIG. 3 it is a sectional view similar to that shown in FIGS. 1 and 2 and further showing formation of gate insulator and an insulating layer on the exposed surface of the substrate.

Then, with reference to FIG. 3, gate insulator 38 of the device is formed by for example growing oxide, and simultaneously therewith, an insulating layer 40, for example SiO$_2$, is formed by for example growing oxide on the exposed surface 34 of the substrate 22. In current technology, the resulting gate insulator 38 is very thin, i.e. for example less than 30 angstroms thick. The insulating layer 40 on the surface 34 of the substrate 22, growing at substantially the same rate as the gate insulator 38, is also very thin, i.e., is substantially the same thickness as the gate insulator 38.

Figure 4:
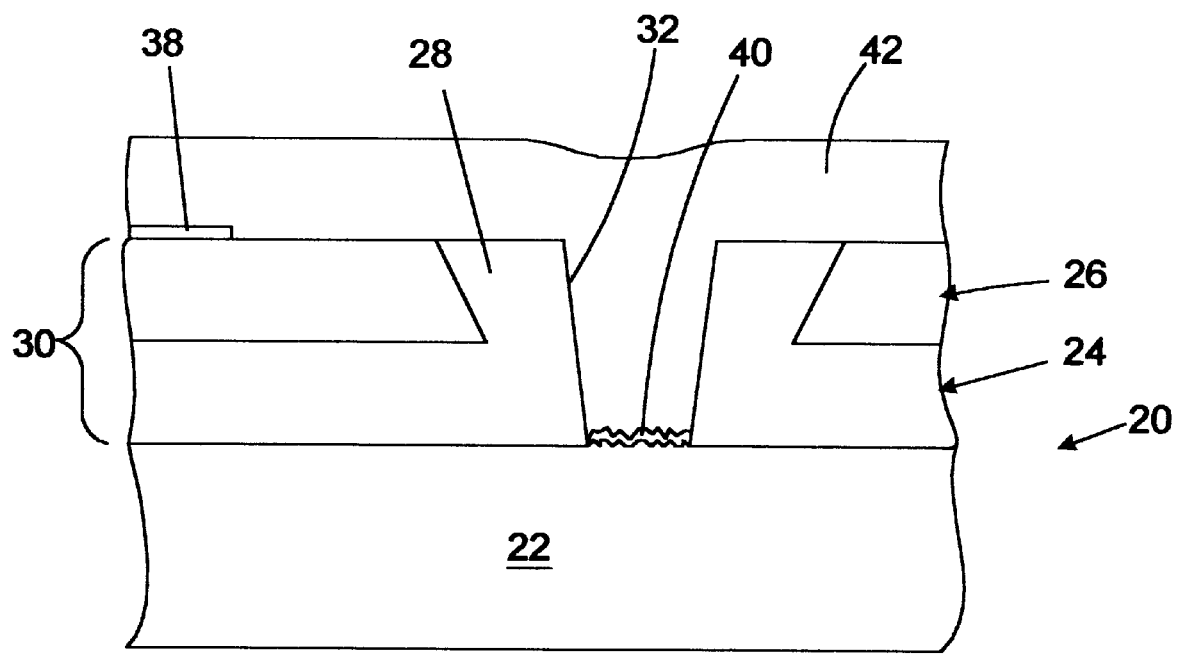
FIG. 4 is a sectional view similar to that shown in FIGS. 1–3 and further showing deposition of polysilicon thereover.
Figure 5:
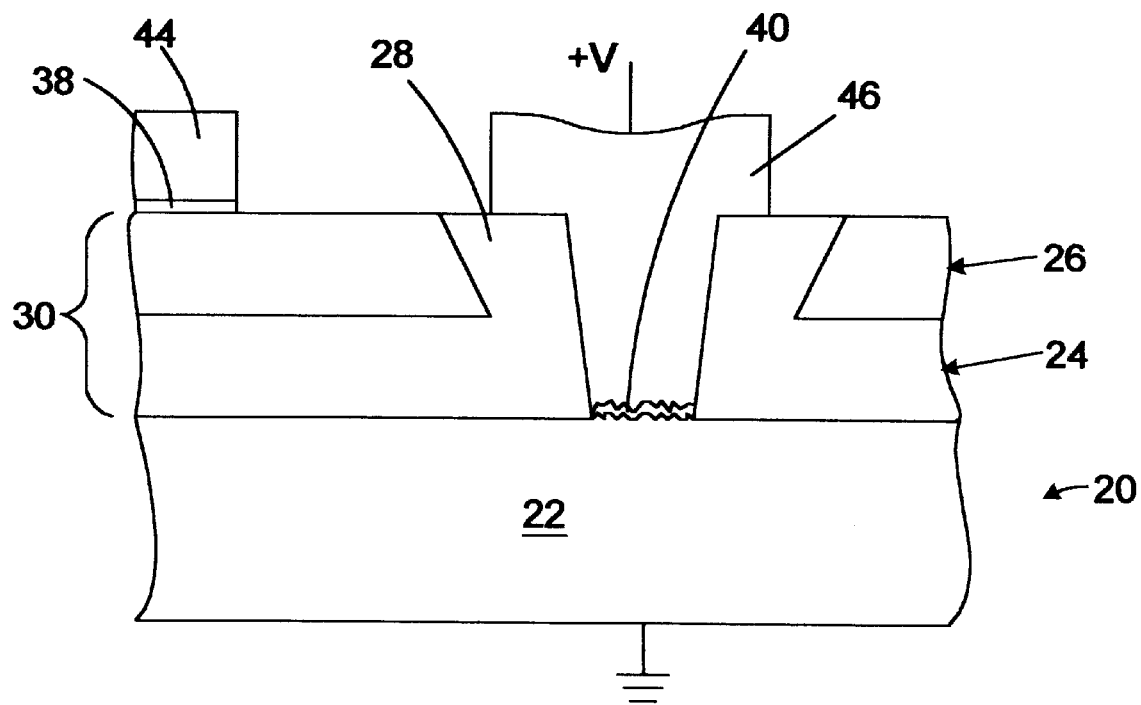
FIG. 5 is a sectional view similar to that shown in FIGS. 1–4 and further showing the polysilicon layer patterned into a gate and a contact, with an electrical potential being applied across the contact and the substrate.

Next (FIG. 4), a layer of polysilicon 42 is deposited over the resulting structure to a thickness of for example 1000–2000 angstroms, the height of the trench 32 with advantage being less than twice the width thereof so that the polysilicon 42 becomes fully deposited in the trench 32. The polysilicon layer 42 is then patterned in a manner well known (FIG. 5) to provide a portion which will become the gate 44 of a device, and a portion which will become the front side contact 46 as will later be described.

In order for the polysilicon contact material 46 in the trench to provide an ohmic contact to the silicon substrate 22, an electrical potential is placed across the contact 46 and the silicon substrate 22, such potential being sufficient to cause the insulating layer 40 to break down, so that the insulating layer 40 becomes conductive. As described above, the insulating layer 40 is quite thin, lending itself to such breakdown. Also, as noted above, the surface 34 of the silicon substrate 22 on which the insulating layer 40 is provided is rough, due to the etching step described. The roughness of the surface 34 promotes formation of a rough, uneven, irregular insulating layer 40 of non-uniform thickness, so that such insulating layer 40 may readily be broken down upon application of electrical potential thereacross. In fact, the insulating layer 40 may be so irregular as to have non-insulating regions in its initially formed state, so that an ohmic contact is provided between the contact 46 and substrate 22 without the step of applying such potential.

Stated another way, if the insulating layer 40 provided on the exposed surface 34 of the substrate 22 is sufficiently thin, the surface 34 of the substrate 22 on which it is formed can be relatively smooth, and conductivity of the insulating layer 40 can be achieved through application of electrical potential as described above. On the other hand, with sufficient roughness of the exposed surface 34 of the substrate 22, the resulting insulating layer formed thereon may be highly irregular and have portions which are non-insulating, so that ohmic contact between the contact 46 and the substrate 22 are achieved upon application of a lower potential, or even without applying such electrical potential.

Figure 6:
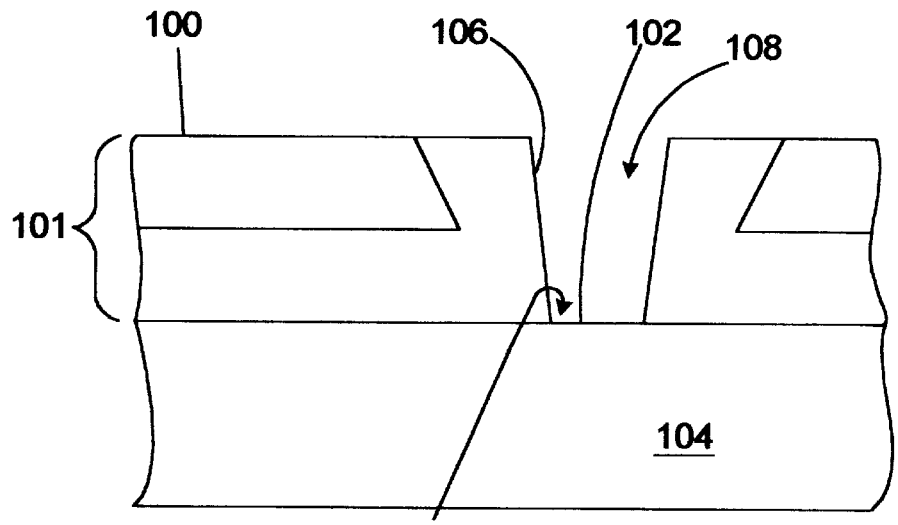
FIG. 6 is a sectional view similar to that shown in FIG. 2, but showing surfaces of the structure in a cleaned state.
Figure 7:
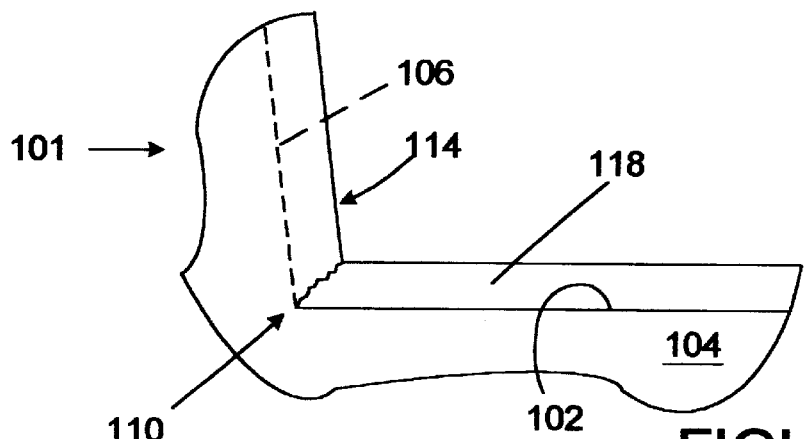
FIG. 7 is an enlarged view of a portion of the structure of FIG. 6.
Figure 8:
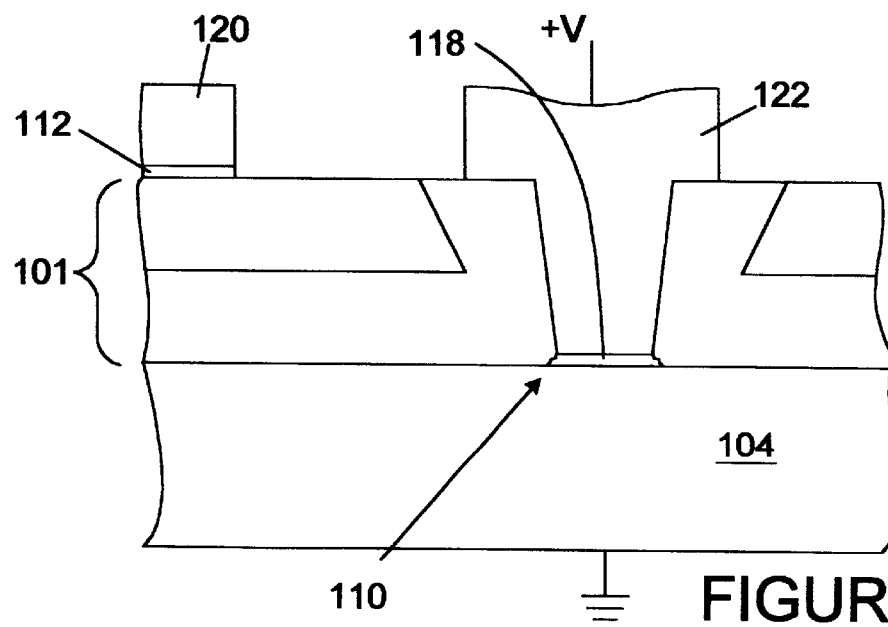
FIG. 8 is a sectional view similar to that shown in FIG. 6, and further showing the gate, gate insulator and contact in place.

FIG. 6 shows a view similar to that shown in FIG. 2. However, in the structure of FIG. 6, as the surface 100 of the silicon of the SOI structure is cleaned for preparation of gate insulator formation thereon, the exposed surface 102 of the silicon substrate 104 is also cleaned in the same manner and at the same time to provide a more planar surface. This results in the wall 106 of the trench 108 and the exposed surface 102 of the substrate 104 meeting at an abrupt angle defining a sharp corner 110. Then, as the gate insulator 112 and insulator 114 in the trench 108 (for example SiO$_2$) are grown or otherwise formed, the insulator formed in the corner 110 is of poor quality, i.e., is irregular and may well have non-insulating regions (FIG. 7). Subsequent to formation of the layer 118 on the surface 102, polysilicon is deposited and patterned as described above, forming gate 120 and contact 122 (FIG. 8). The portion of the insulating layer 118 in the corner 110 lends itself readily to breakdown upon application of electrical potential across the contact 122 and substrate 104. Indeed, as described above, the insulating material in the corner 110 may be of sufficiently poor quality that an ohmic contact is already achieved between the contact 122 and the substrate 104 without application of electrical potential across the contact 122 and substrate 104.

Figure 9:
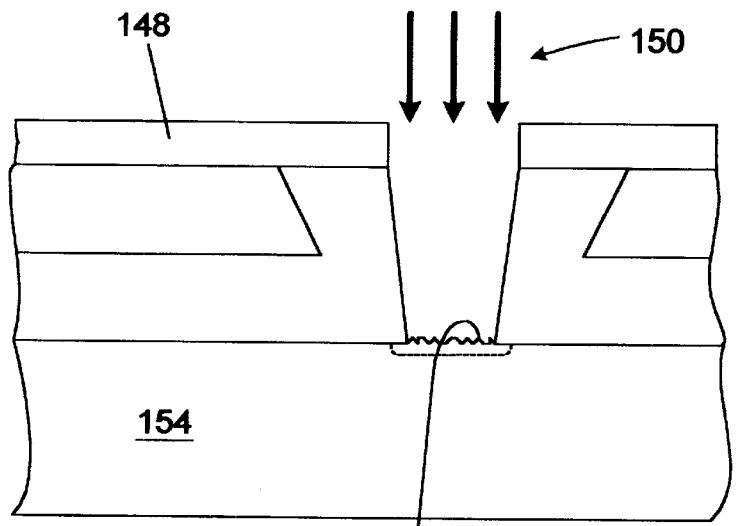
FIG. 9 is a sectional view similar to that shown in the FIG. 2, and further showing another embodiment of the invention.
Figure 10:
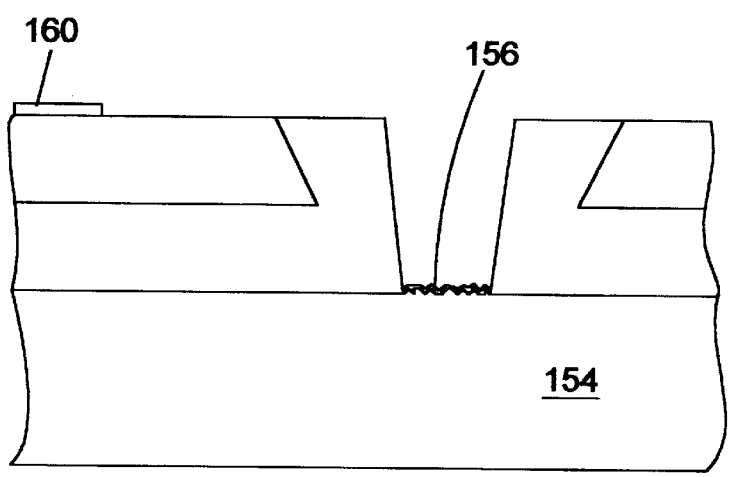
FIG. 10 is a sectional view similar to that shown in FIG. 9, and showing the gate insulator and insulator layer on the exposed surface of the substrate.
Figure 11:
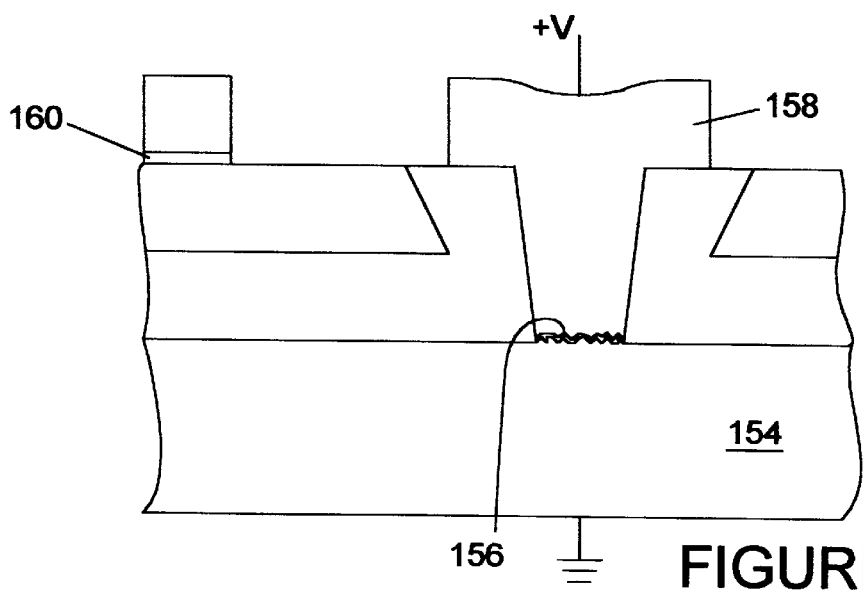
FIG. 11 is a sectional view similar to that shown in FIGS. 9 and 10 and showing the gate and contact in place, with an electrical potential being applied across of the contact and the substrate.

In yet another embodiment, FIG. 9 shows a structure similar to that shown in FIG. 2. Prior to further processing steps, after suitable masking 148, an N$_2$ ion implant 150 is undertaken into the exposed, etched surface 152 of the substrate 154. This nitrogen implant causes the insulating layer 156 (for example SiO$_2$) subsequently grown on the surface 152 (FIG. 10) to grow more slowly than previously described so that when the gate insulator 160 is grown to its chosen thickness, the insulating layer 156 on the surface 152 of the substrate 154 is for example ½ as thick. This extremely thin insulating layer 156 lends itself even more readily to failure or breakdown upon application of voltage thereacross so that an ohmic contact is provided between the contact 158 and the substrate 154 (FIG. 11). In fact, when combined with the etching step described above to expose the surface 152 of the substrate 154, the insulating layer 156 may be of sufficiently poor, irregular quality that an ohmic contact is achieved between the contact 152 and substrate 154 without resort to applying electrical potential across the contact and substrate.

In those embodiments wherein electrical potential is applied in order to achieve breakdown of the insulating layer, if the operating range of the device is for example less than 2 ½ volts, the potential applied for such breakdown voltage applied may be on the order of 5 volts. However, it will readily be seen that this applied potential can vary widely, depending on the device environment as described above.

Subsequent to the steps of each embodiment shown and described above, further normal processing is undertaken as will be well known.

It will be understood that in each embodiment, the contact shown and described may be one of many on the wafer, so that frontside contact is achieved at many places on the wafer.

It will therefore be seen through these several embodiments that frontside contact to a silicon substrate of an SOI wafer is achieved. The processes described above can be combined in a variety of ways so that breakdown of the insulating layer is achieved in an appropriate manner. While several examples have been included for providing insulating material in the trench by growing an oxide layer, it will be understood that the objects of the invention are consistent with providing such insulation layer in a variety of ways, as long as sufficient thinness and/or irregularity are achieved.

Moreover, the present methods of providing frontside contact to the substrate are achieved without the complications of opening and covering trench regions during ion implantation, as in the above-cited patent.

The foregoing description of the embodiment of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of providing a frontside contact to a substrate on which a silicon-on-insulator structure is disposed, comprising:
   providing a trench in the silicon-on-insulator structure to expose a surface of the substrate;
   forming an insulating layer on the exposed surface of the substrate;
   providing contact material in the trench; and
   providing an electrical potential across the contact material and substrate sufficient to increase the conductivity of the insulating layer.

2. The method of claim 1 and further comprising the step of etching the trench in the silicon-on-insulator structure to expose an etched surface of the substrate, the insulating layer being formed on the etched surface of the substrate.

3. The method of claim 2 wherein the insulating layer is grown on the exposed surface of the substrate.

4. The method of claim 1 and further comprising the step of forming a gate insulator simultaneously with the formation of the insulating layer on the exposed surface of the substrate.

5. The method of claim 4 and further comprising the step of forming the gate insulator and the insulating layer on the exposed surface of the substrate to substantially the same thickness.

6. The method of claim 4 and further comprising the step of forming the insulating layer on the exposed surface of the substrate to a thickness less than the thickness of the gate insulator.

7. The method of claim 6 and further comprising the step of implanting nitrogen into the exposed surface of the substrate prior to forming the insulator thereon.

8. The method of claim 1 and further comprising the step of implanting nitrogen into the exposed surface of the substrate prior to forming the insulator thereon.

9. The method of claim 1 and further comprising the step of providing that the exposed surface of the substrate and the wall of the trench meet at an abrupt angle prior to the insulating layer being formed on the exposed surface of the substrate.

10. A method of providing a frontside contact to a substrate on which a silicon-on-insulator structure is disposed, comprising:
    etching a trench in the silicon-on-insulator structure to expose a surface of the substrate;
    forming an insulating layer on the exposed surface of the substrate; and
    providing contact material in the trench and over the insulating layer.

11. The method of claim 10 wherein the insulating layer is grown on the exposed surface of the substrate.

12. A method of providing a frontside contact to a substrate on which a silicon-on-insulator structure is disposed, comprising:
    providing a trench in the silicon-on-insulator structure to expose a surface of the substrate, the wall of the trench and the surface of the substrate meeting at an abrupt angle;
    forming an insulating layer on the exposed surface of the substrate; and
    providing contact material in the trench.

13. The method of claim 12 wherein the insulating layer is grown on the exposed surface of the substrate.

14. A method of providing a frontside contact to a substrate on which silicon-on-insulator structure is disposed, comprising:
    providing a trench in the silicon-on-insulator structure to expose a surface of the substrate;
    implanting nitrogen into the exposed surface of the substrate;
    growing an insulating layer on the exposed surface of the substrate; and
    providing contact material in the trench.

* * * * *